US006516990B2

(12) United States Patent
Hess et al.

(10) Patent No.: US 6,516,990 B2
(45) Date of Patent: Feb. 11, 2003

(54) APPARATUS FOR MAKING WIRE CONNECTIONS

(75) Inventors: Peter Hess, Alpnachstad (CH); Carlo Durrer, Buochs (CH); Elmar Ottiger, Kriens (CH)

(73) Assignee: ESEC Trading SA, Cham (CH)

( * ) Notice: Subject to any disclaimer, the term of this patent is extended or adjusted under 35 U.S.C. 154(b) by 0 days.

(21) Appl. No.: 09/909,459

(22) Filed: Jul. 19, 2001

(65) Prior Publication Data

US 2002/0008131 A1 Jan. 24, 2002

(30) Foreign Application Priority Data

Jul. 21, 2000 (CH) .............................................. 1445/00

(51) Int. Cl.⁷ .......................... B23K 37/00; B23K 31/02
(52) U.S. Cl. ........................... 228/4.5; 228/9; 228/105; 228/180.5
(58) Field of Search ................. 228/105, 103, 228/4.5, 180.5, 9, 10, 11

(56) References Cited

U.S. PATENT DOCUMENTS

| | | | | |
|---|---|---|---|---|
| 3,813,022 A | * | 5/1974 | Radobenko | 228/4.1 |
| 4,039,114 A | * | 8/1977 | Yoshida et al. | 228/1.1 |
| 4,671,446 A | * | 6/1987 | Sherman | 228/105 |
| 4,718,591 A | * | 1/1988 | Hill | 228/1.1 |
| 4,763,827 A | | 8/1988 | Watanabe et al. | |
| 4,789,093 A | * | 12/1988 | Bansemir | 219/56.21 |
| 4,813,588 A | * | 3/1989 | Srivastava et al. | 228/103 |
| 5,113,565 A | * | 5/1992 | Cipolla et al. | 228/102 |
| 5,199,628 A | * | 4/1993 | Homma | 228/4.5 |
| 5,667,130 A | * | 9/1997 | Morita et al. | 228/1.1 |
| 5,702,049 A | * | 12/1997 | Biggs et al. | |
| 5,897,048 A | | 4/1999 | Cheng et al. | |

FOREIGN PATENT DOCUMENTS

| | | | |
|---|---|---|---|
| JP | 353033575 A | * | 3/1978 |
| JP | 358159340 A | * | 9/1983 |
| JP | 360063945 A | * | 4/1985 |
| JP | 401017434 A | * | 1/1989 |
| JP | 404369232 A | * | 12/1992 |
| WO | WO98 53485 A | | 11/1998 |

OTHER PUBLICATIONS

US 2002/0008131 A1 Hess et al. (Jan. 24, 2002).*

* cited by examiner

*Primary Examiner*—Tom Dunn
*Assistant Examiner*—Kiley Stoner
(74) *Attorney, Agent, or Firm*—McCormick, Paulding & Huber LLP

(57) ABSTRACT

An apparatus for making wire connections between a first connection area and a second connection area by means of a capillary. The apparatus contains an image recognition system which is designed so that the tip of the capillary enters the image area of the image recognition system immediately before impacting on the respective connection area. In this way, the position of the desired point of impact of the capillary on the connection area as well as the position of the tip of the capillary can be determined with the same measuring system, evaluated and used for the precise control of the movement of the capillary.

5 Claims, 3 Drawing Sheets

Figure 1:
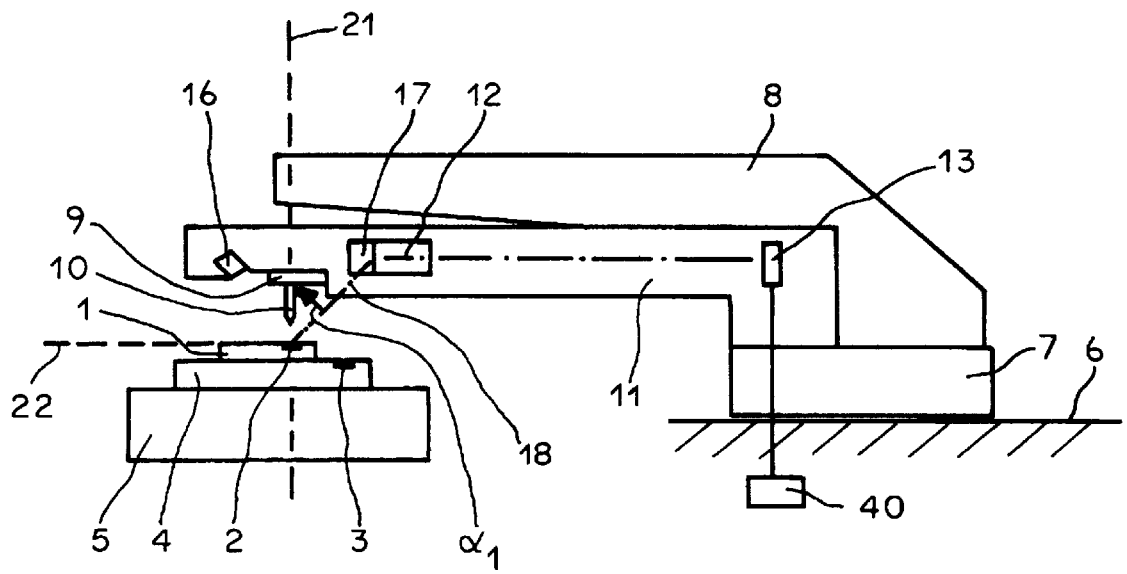

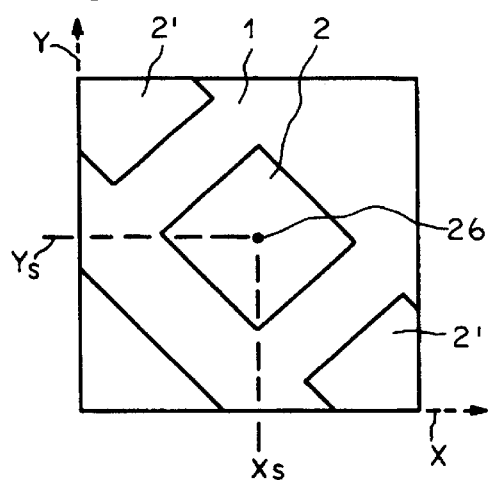
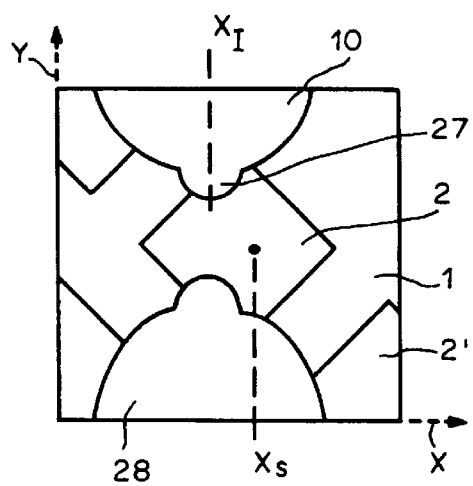
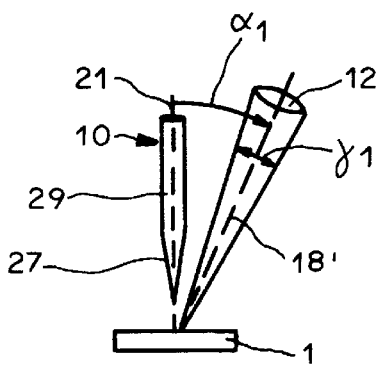
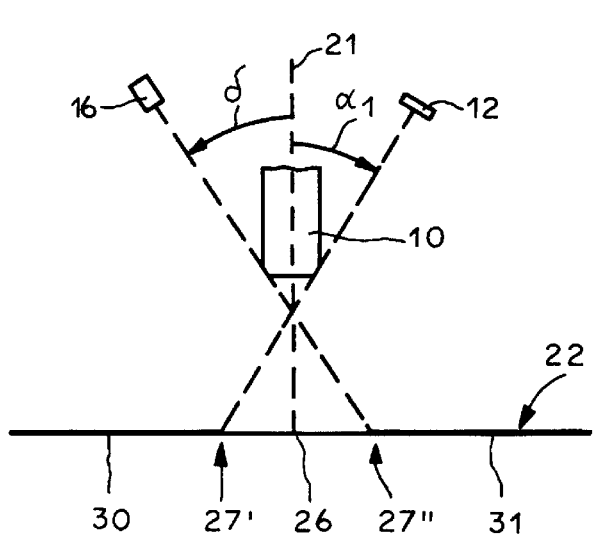

APPARATUS FOR MAKING WIRE CONNECTIONS

BACKGROUND OF THE INVENTION

In the semiconductor industry, such apparatuses are generally known as Wire Bonders. They are used to make wire connections between the pads of a semiconductor chip and a substrate. The Wire Bonder has a bondhead which is movably guided in the horizontal plane. The bondhead comprises a rocker that can be turned on a horizontal rotational axis. The rocker comprises a horn at the tip of which a capillary is clamped which guides the bonding wire. In addition, the bondhead comprises an image recognition system for determining the position of the pads on the semiconductor chip. The image recognition system is designed and placed so that its field of view is located laterally adjacent to the capillary whereby the optical axis of the image recognition system impinges vertically on the semiconductor chip or the substrate. This means that essentially, the beams of the image recognition system run parallel to the longitudinal axis of the capillary.

Temperature fluctuations lead to the effect that the optical axis and the tip of the capillary may shift in relation to one another. As a result of this temperature drift, the capillary no longer places the bonding wire at the intended point on the pad. In order to avoid such incorrect placements, the position of the capillary in relation to the optical axis of the image recognition system must be redefined at short time intervals. This is particularly the case for the so-called Fine Pitch and Ultra Fine Pitch applications with which the distance from pad centre to pad centre amounts to only 50 $\mu$m or even 35 $\mu$m.

The object of the invention is to develop a measuring system with which the position of the capillary in relation to that of the pad to be bonded can be reliably determined for very small pad centre to pad centre distances of only 35 $\mu$m or even 20 $\mu$m even with temperature fluctuations.

BRIEF DESCRIPTION OF THE INVENTION

In accordance with the invention, disclosed is a method and apparatus for making wire connections between a first connection area and a second connection area on a workpiece. The apparatus includes a capillary for making the connections and contains an image recognition system designed so that the tip of the capillary arrives in the image area of the image recognition system immediately before the capillary impinges on the respective connection area. Therefore, the position of the desired point of impact of the capillary on the connection area as well as the position of the tip of the capillary can be measured by the same measuring system, evaluated and used for precise control of the movement of the capillary.

The image recognition system comprises an optical system and a camera, whereby the optical system projects the contact area lying in a horizontal plane onto the camera with a predetermined enlargement, and is constructed so that the camera does not see the respective connection area vertically from above but inclined at a predetermined angle to the vertical and only then when the connection area is located beneath the tip of the capillary.

As long as the height of the tip of the capillary above the respective connection area is not known, the position of the tip of the capillary in relation to the contact area can only be determined in relation to the coordinate direction running laterally to the viewing direction. In order to also determine the position of the tip of the capillary in relation to a second coordinate direction, it is suggested in accordance with the invention either to expand the image recognition system with a second optical system and a second camera, whereby the second camera sees the connection area from a second viewing direction, or to illuminate the capillary under defined conditions and to determine the position of the tip of the capillary in relation to the second coordinate direction by also taking the shadow of the capillary into consideration.

In the following, these two examples of the invention are explained in more detail as preferred embodiments based on the drawing.

BRIEF DESCRIPTION OF THE DRAWING FIGURES

Figure 2:
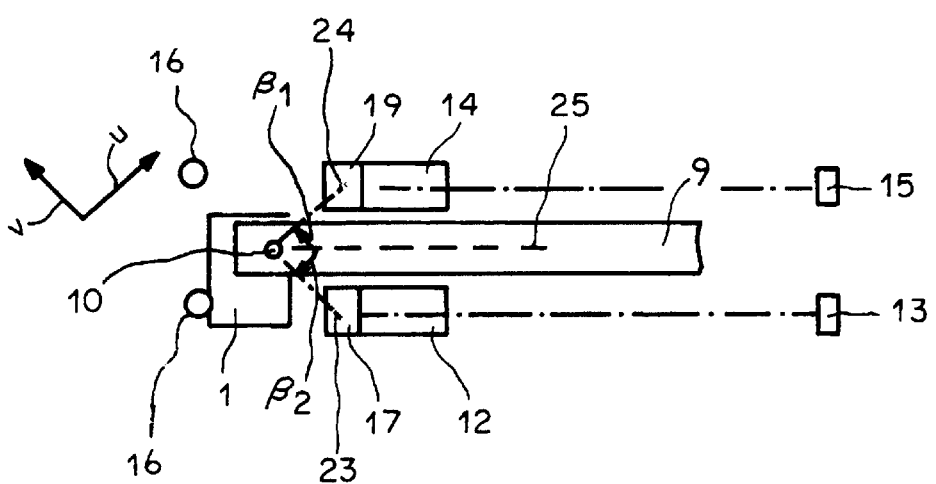
Figure 7:
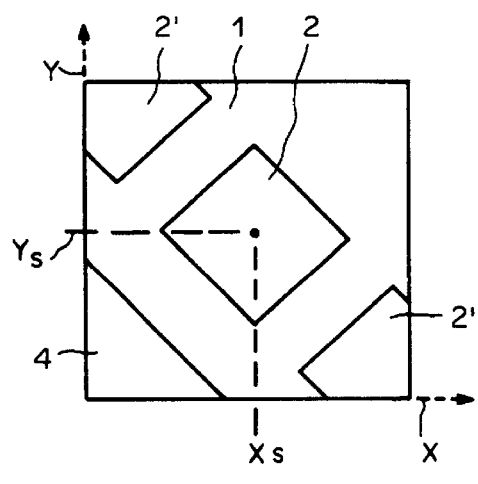
Figure 8:
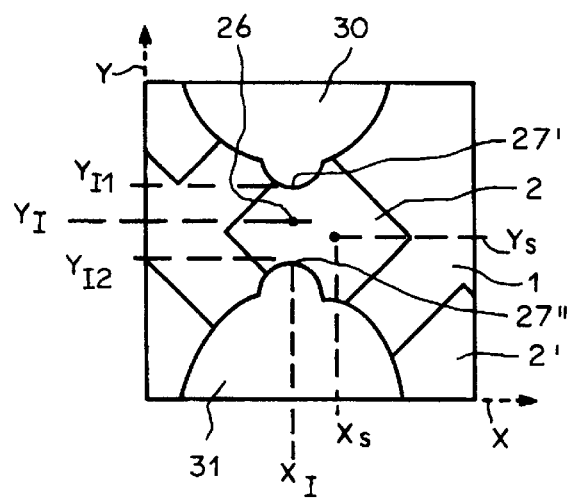

It is shown in:

FIG. 1 A schematic presentation of parts of an apparatus for making wire connections, FIG. 2 A plan view of parts of the apparatus, FIG. 3 An image taken by a camera, FIG. 4 A further image taken by the camera, FIG. 5 Parts of a further apparatus for making wire connections, FIG. 6 The geometrical relationship between the illumination of the capillary and the viewing axis of the camera, and FIGS. 7, 8 Images taken by the camera.

DETAILED DESCRIPTION OF THE INVENTION

Embodiment 1

FIG. 1 shows a schematic presentation not drawn to scale of the parts of an apparatus for making wire connections between a first connection area 2, a so-called pad, located on a semiconductor chip 1 and a second connection area 3. FIG. 1 only shows the parts of the apparatus which are necessary for the understanding of the invention. The semiconductor chip 1 is located on a substrate 4 which is presented on a support platform 5 for making the wire connections. The second connection area 3 is located, for example, on the substrate 4. The apparatus has a bondhead 7 movable in a horizontal plane 6. The bondhead 7 comprises a rocker 8 rotatable on a horizontal axis. A horn 9 to which ultrasonics can be applied is attached to the rocker 8. A capillary 10 is clamped onto the tip of the horn 9. The capillary 10 serves to bond a wire to the two connection areas 2, 3 as well as to guide the wire between them. A carrier 11 with optical elements for measuring the position of the connection areas 2 and 3 and the position of the tip of the capillary 10 is secured to the bondhead 7. The optical elements belong to the image recognition system. The carrier 11 is located laterally adjacent to the horn 9.

With the first embodiment, the image recognition system consists of two subsystems, namely a first optical system 12 and a first camera 13 and a second optical system 14 and a second camera 15, means of illumination 16 as well as electronic image processing modules 40 for processing and evaluation of the images delivered by the two cameras 13 and 15. In the side view of FIG. 1, the second optical system 14 and the second camera 15 are not visible. The first optical system 12 is arranged in the beam path between the semiconductor chip 1 and the first camera 13. It consists of optical elements which enlarge the image of the semiconductor chip 1 projected onto the camera 13, for example by a factor of 8, and a first mirror 17 which is arranged so that the first camera 13 sees the semiconductor chip 1 or the substrate 4 from a first predetermined direction 18. The second optical system 14 is arranged in the beam path between the semiconductor chip 1 and the second camera 15. It is constructed analogously to the first optical system 14 and has a second mirror 19 (FIG. 2) which is arranged so that the second camera 15 sees the semiconductor chip 1 or the substrate 4 from a second predetermined direction 20 (not visible). The directions 18 and 20 correspond to the optical axes of the two optical systems 12 or 14, respectively, on the side facing the capillary 10.

FIG. 2 shows a plan view of the semiconductor chip 1, the horn 9, the capillary 10, the two optical systems 12, 14 with the mirrors 17, 19 and the means of illumination 16. For reasons of illustration clarity, the carrier 11 (FIG. 1) is not drawn. The directions 18 and 20 are presented as chain-dotted lines in their projections 23 and 24 onto the plane 22 (FIG. 1) of the semiconductor chip 1. The directions 18 (FIG. 1) and 20 can each be characterised by polar coordinates $(\alpha_1, \beta_1)$ and $(\alpha_2, \beta_2)$, respectively, whereby the angle $\alpha$ designates the angle to the vertical 21 (FIG. 1) and the angle $\beta$ the angle in relation to a predetermined horizontal direction 25.

The coordinate axis u is assigned to the axis in the plane 22 running perpendicular to the projection 23 of direction 18. The coordinate axis v is assigned to the axis in the plane 22 running perpendicular to the projection 24 in direction 20. The coordinate axes u and v include the angle $\phi=\beta_2+\beta_1$. The directions 18 and 20 are preferably selected so that the angle $\phi$ amounts to around 90°. The two angles $\alpha_1$ and $\alpha_2$ are different to zero, preferably equally large and lie preferably in a range between 10° and 30°. For reasons of clarity, the coordinate system set up by means of the coordinate axes u, v is presented shifted parallel to the projections 23, 24 of the directions 18 and 20.

The cameras 13, 15 each deliver a two-dimensional image which consists of, for example, 640*480 pixels. Each image is assigned a right-angled system of coordinates with the image axes x and y. The horizontal x-axis of the image of the first camera 13 corresponds to the coordinate axis u, while the vertical y-axis of the image of the first camera 13 corresponds to the coordinate axis v (but only when the angle $\phi$ amounts to $\phi=90°$). The coordinate axis u is projected undistorted and to scale on the x axis of the first camera 13 while the coordinate axis v is projected distorted and not to scale on the y axis of the first camera 13. With the second camera 15, it is the other way round: Here, the coordinate axis v is projected undistorted and to scale on the x axis of the second camera 15 while the coordinate axis u is projected distorted and not to scale on the y axis of the camera 15.

By means of a calibration measurement, the relationship between the x axis of the image of the first camera 13 and the coordinate axis u as well as the relationship between the x axis of the image of the second camera 15 and the coordinate axis v are determined so that they are available for the correction of the movement path of the capillary 10. This means that after calibration each pixel of the first camera 13 can be assigned a value of the coordinate axis u and each pixel of the second camera 15 can be assigned a value of the coordinate axis v.

The image recognition system serves to determine the expected point of impact of the capillary 10 on the contact area 2 of the semiconductor chip 1 immediately before impact so that the movement of the capillary 10 can be corrected when the deviation between the expected point of impact and the desired point of impact is too large. For this purpose, two successive measurements are carried out. The first measurement serves to determine the position of the pre-programmed point of impact of the capillary 10 on the connection area 2. The first measurement takes place preferably while the capillary 10 is located outside the field of view of the cameras 13, 15 and does not obstruct the view of the connection area 2.

FIG. 3 shows the image of the semiconductor chip 1 taken by the camera 13 for the first measurement. The image contains only a part of the semiconductor chip 1. The connection area 2 appears as a light area on a dark background. In addition, parts of neighbouring connection areas 2' are also visible in the image. By means of a generally known algorithm, the pixel coordinate $x_s$ of the desired point of impact 26 of the capillary 10 is now determined. The pixel coordinate $y_s$ does not have to be determined here. Even when each pixel of camera 13 is characterised by a pair of integers, the pixel coordinate $x_s$ of the desired point of impact 26 determined by evaluation of the image of the first camera 13 does not have to be an 30 integer number.

The second measurement serves to determine the position of the tip of the capillary 10. The second measurement takes place when the capillary 10 has reached its so-called search height H above the connection area 2 and momentarily stops or while the capillary 10 passes through the search height H. The search height H is a predetermined point in the path section which the capillary 10 passes through immediately before impact (touchdown) on the semiconductor chip 1. The search height H is located typically 100 µm to 150 µm above the surface of the semiconductor chip 1. Usually, the capillary 10 oscillates on its strongly accelerated movement. But as soon as the capillary 10 has reached its search height H or passes through it with relatively low speed, these oscillations have died down to such an extent that the second measurement can take place.

FIG. 4 shows the image taken by the camera 13 for the second measurement. Parts of the connection area 2 are now covered by the capillary 10. Furthermore, the shadow 28 of the capillary 10 is visible as a dark area. The shadow 28 of the capillary 10 has the same affect as if parts of the connection area 2 were covered. The tip 27 of the capillary 10 appears as a semi-circular shaped area and, by means of a known image analysis process, it is possible to determine the pixel coordinate $x_1$ of the expected point of impact of the tip 27 of the capillary 10. In the example shown, the tip 27 of the capillary 10 deviates by a pixel distance of $\Delta x1 = x_1 - x_s$ from its set position in x direction. This deviation can now be converted into a physical distance $\Delta u$ on the coordinate axis u and a corresponding corrective movement of the capillary 10 can be instigated in relation to the coordinate axis u.

The pixel coordinate $y_1$ of the expected point of impact of the capillary 10 on the connection area 2 in y direction, however, cannot be determined from the representation of the capillary 10 in the image of the camera 13 because the exact height of the capillary 10 above the connection area 2 is not known. However, by means of the two images taken by the second camera 15, the pixel coordinates $x_s$ and $x_1$ can be determined in the same way whereby the coordinate x again designates the horizontal x-axis of the camera 15. The pixel distance $\Delta x2 = x_1 - x_s$ for the second camera 15, however, corresponds to a physical distance $\Delta v$ on the coordinate axis v. Therefore, based on the determined pixel distance $\Delta x2$, a corrective movement of the capillary 10 can be initiated in relation to the coordinate axis v.

Under certain circumstances it is possible to omit the first measurement and to determine the information concerning the position of the desired point of impact of the capillary 10 and the expected position of the point of impact of the capillary 10 from the two images taken for the second measurement.

The two beam paths between the semiconductor chip 1 and the two cameras 13 and 15 are arranged symmetrically in relation to the longitudinal axis of the horn 9 (FIG. 1) and differ only in the angle β at which the semiconductor chip 1 and the capillary 10 are seen by the assigned camera 13 or 15. For this reason, only the beam path formed between the semiconductor chip 1 and the first camera 13 whose characteristics are determined by the angle $\alpha_1$ and the first optical system 12 is described in the following based on FIG. 5.

In order that the second measurement is at all possible, the tip 27 of the capillary 10 must be located in the field of view of the camera 13 and therefore within the aperture angle $\gamma_1$ of the optical system 12.

Hence the angle $\alpha_1$ of the optical axis 18' to the vertical 21 and the aperture angle $\gamma_1$ of the optical system 12 must be selected according to the shape of the capillary 10 and be coordinated in such a way that the tip 27 of the capillary 10 is not covered by the shaft 29 of the capillary 10: The angle $\alpha_1$ should therefore be as large as possible. On the other hand, the visibility of the connection area 2 of the semiconductor chip 1 to be bonded must not be obstructed by wires which have already been bonded: The angle $\alpha_1$ should therefore be as small as possible.

The aperture angle $\gamma_1$ of the optical system 12 should be as small as possible so that the visibility is not obstructed by the shaft 29 of the capillary 10 or by wires which have already been bonded. On the other hand, the aperture angle $\gamma_1$ determines the optical resolution of the optical system 12 and therefore the achievable optical resolution: The larger the aperture angle $\gamma_1$, the larger the optical resolution however the smaller the depth of focus. The aperture angle $\gamma_1$ and the enlargement factor of the optical system 12 should be defined so that the connection area 2 as well as the tip 27 of the capillary 10 when it is located at the search height H are projected with sufficient sharpness onto the camera 13. Furthermore, the enlargement factor should be selected so that the optical resolution and the resolution of the camera 13 determined by the pixel distance correspond to one another.

The optical resolution however is not only dependent on the aperture angle $\gamma_1$ of the optical system 12 but also on the wavelength λ of the light radiated by the means of illumination 16 (FIG. 1). The lower the wavelength λ, the greater the resolution at the given aperture angle $\gamma_1$. Blue light is therefore preferably used for the illumination. With experimental use on an existing model 3088 Wire Bonder of the applicant, an optical system 12 with an aperture angle $\gamma_1$ of around 15° and an enlargement factor of 8 proved successful.

The means of illumination 16 are preferably arranged so that the light reflected on the connection area 2 falls on the optical axis 18'. This results in a high contrast between the connection area 2 and its surroundings so that a perfect image evaluation is possible with comparatively low light output. However, diffused lighting is also possible which leads to lower contrast but to a better reproduction of details.

The two cameras 13 and 15 can be realised as CCD cameras on one single chip whereby the two optical systems 12 and 14 project their images onto adjacent areas of the CCD chip.

Embodiment 2

With the second embodiment, in contrast to the first embodiment, only the first optical system 12 and the first camera 13 are provided and the second optical system 14 and the second camera 15 are omitted. The determination of a possible deviation of the expected point of impact of the tip of the capillary 10 from the desired point of impact in relation to the direction of the coordinate axis u takes place as for the first embodiment. However, the determination of a possible deviation of the expected point of impact of the tip of the capillary 10 from the desired point of impact in respect to the direction of the coordinate axis v now also employs the shadow of the capillary 10. With this embodiment, the coordinate axis v corresponds to the direction of the projection 23 (see FIG. 2) of direction 18. In order that this is possible, the means of illumination 16 are arranged so that the light sent out impinges on the connection area 2 at the angle $\delta=\alpha_1$ whereby the angle $\alpha_1$ represents the angle in relation to the vertical 21 at which the camera 13 sees the connection area 2. In FIG. 6 the resulting geometrical relationships are presented whereby FIG. 6 shows a section through the plane set up by the vertical 21 which runs longitudinally through the capillary 10 and the direction 18. The reference numeral 30 designates the image of the capillary 10 projected onto the plane 22 and the reference numeral 31 designates the shadow of the capillary 10 falling on the plane 22. The image of the camera 13 corresponds to a representation of the plane 22. Because the angles δ and $\alpha_1$ are the same size, in the image of the camera 13, the tip 27' of the image 30 of the capillary 10 and the tip 27" of the shadow 31 of the capillary 10 are the same distance away from the expected point of impact 26 of the capillary 10.

Now, with the evaluation of the first image taken as is shown in FIG. 7, not only the pixel coordinate $x_s$, but also the pixel coordinate $y_s$ is determined from the image of the connection area 2. From the second image taken which is presented in FIG. 8, the pixel coordinate $x_1$ is then determined as for the first embodiment. In addition, the pixel coordinate $y_{11}$ of the tip 27' of the capillary is determined by evaluation of the image 30 of the capillary 10 and the pixel coordinate $y_{12}$ of the tip 27" of the capillary shadow 31 is determined by evaluation of the image of the shadow 31. The pixel coordinate $y_1$ of the expected point of impact can then be calculated as $y_1=\frac{1}{2}(y_{11}+y_{12})$. The correction vector then results in ($\Delta x=x_1-x_s, \Delta y=y_1-y_s$). This correction vector must now be transformed into a correction vector corresponding to the u, v system of coordinates so that the offset position of the capillary 10 determined in the pixel system of the camera 13 can be brought to disappear by means of a movement correction so that the capillary 10 impacts at the correct location on the connection area 2. In order that this is possible, a calibration procedure must first be carried out so that the distances established in the x, y system of coordinates of the camera 13 can be converted into distances in the u, v system of coordinates. The calibration can take place, for example, in such a way that an image is made of a calibration plate with reference points, the pixel coordinates of the reference points are determined, the bondhead is then moved by a specific distance in the u, v system of coordinates, a second image is taken of the calibration plate and the new pixel coordinates of the reference points are determined.

The second embodiment is cheaper than the first embodiment because only one optical system, one camera and one image processing module are necessary. However, the first embodiment offers the advantage that two different variants are available in order to determine the offset of the capillary 10. Basically, each time an already bonded wire obstructs or largely obstructs the beam path between the connection area 2 and the first camera 13 a measurement can be carried out by means of the second optical system 14 and the second camera 15 in accordance with the second embodiment under consideration of the information contained in the shadow of the capillary. By the same token, a measurement can be carried out by means of the first optical system 12 and the first camera 13 in accordance with the second embodiment if the beam path to the second camera 15 is obstructed.

Under certain circumstances, the evaluation of the images delivered by the cameras 13 and 15 requires more time than is available without a loss in throughput. In order to compensate thermal drifts however, it is quite sufficient when the information concerning the offset of the capillary 10 acquired while bonding a connection area is only taken into consideration when bonding the next or next but one connection area.

A further advantage of the apparatuses in accordance with the invention exists in that an image of the bonded connection can be made immediately after bonding without the bondhead 7 having to carry out a special movement in order to bring the optical system above the bond location as with today's systems. Furthermore, it is then possible to analyse the position of the bonded connection and to take this also into consideration for control of the capillary. Furthermore, the inclined view opens up new possibilities for assessing the quality of the wire connections made in that, for example, it is now visible when a wire sags.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

We claim:

1. An apparatus for making wire connections between a first connection area and a second connection area of a workpiece, the apparatus comprising:

a planar platform for supporting a workpiece having first and second connection areas, a bondhead movable in a plane parallel to and relative to the platform, a capillary mounted to the bondhead for guiding a wire between the first and second connection areas, and for attaching the wire to the first and second connection areas respectively, an image recognition system having a first and a second camera, a first and a second optical system and an image processing module, the first camera providing an image of the workpiece on the platform and of a tip of the capillary as viewed along an optical axis of the first optical system, the image of the first camera setting up a system of coordinates having a first and second image axis, the optical axis being inclined at a predetermined angle with respect to a perpendicular to the platform, the image processing module receiving the image of the first camera and having means for determining from the image a position of a desired point of impact of the tip of the capillary on one of the first and second connection areas with respect to the first image axis and a position of the tip of the capillary with respect to the first image axis, the second camera providing a second image of the workpiece on the platform and the tip of the capillary as viewed along a second optical axis of the second optical system, the image of the second camera setting up a second system of coordinates having a first and second image axis, the second optical axis being inclined at a second predetermined angle with respect to the perpendicular to the platform, the image processing module or a second image processing module receiving the second image from the second camera and having means for determining the position of the desired point of impact of the capillary on one of the first and second connection areas with respect to the first image axis of the second coordinate system and the position of the tip of the capillary with respect to the first image axis of the second coordinate system, and means connected to the image processing module for controlling the motion of the bondhead relative to the platform.

2. An apparatus for making wire connections between a first connection area and a second connection area of a workpiece, the apparatus comprising:

a planar platform for supporting a workpiece having first and second connection areas, a bondhead movable in a plane parallel to and relative to the platform, a capillary mounted to the bondhead for guiding a wire between the first and second connection areas, and for attaching the wire to the first and second connection areas respectively, an image recognition system having a camera, an optical system and an image processing module, the camera providing an image of the workpiece on the platform and of a tip of the capillary as viewed along an optical axis of the optical system, the optical axis being inclined at a predetermined angle with respect to a perpendicular to the platform, the image of the camera setting up a system of coordinates having a first and second image axis, an illuminator impinging light on the workpiece at a predetermined angle providing a shadow of the tip of the capillary in the image seen by the camera, the image processing module receiving the image of the camera and having means for determining from the image a position of a desired point of impact of the tip of the capillary on one of the first and second connection areas with respect to the first and second image axis and a position of the tip of the capillary with respect to the first and second image axis, the position of the tip of the capillary with respect to the second image axis being determined by utilizing the positions of the tip of the capillary and of the shadow of the tip of the capillary, and means connected to the image processing module for controlling the motion of the bondhead relative to the platform.

3. The apparatus according to claim 2, wherein the light emitted by the illuminator lies in the blue segment of the visible spectrum.

4. The apparatus according to claim 2, wherein the illuminator is arranged in a plane defined by the optical axis of the optical system and the perpendicular to the platform, and wherein the light from the illuminator impinges on the first connection area at an angle to the perpendicular to the platform which is the same size as the angle of the optical axis of the optical system to the perpendicular to the platform.

5. The apparatus according to claim 4, wherein the light emitted by the illuminator lies in the blue segment of the visible spectrum.

* * * * *